United States Patent [19]
Yamasaka

[11] Patent Number: 5,997,653
[45] Date of Patent: Dec. 7, 1999

[54] METHOD FOR WASHING AND DRYING SUBSTRATES

[75] Inventor: Miyako Yamasaka, Yamanashi-ken, Japan

[73] Assignee: Tokyo Electron Limited, Tokyo, Japan

[21] Appl. No.: 08/944,784

[22] Filed: Oct. 6, 1997

[30] Foreign Application Priority Data

Oct. 7, 1996 [JP] Japan .................................. 8-284633

[51] Int. Cl.⁶ .................................................. B08B 5/02
[52] U.S. Cl. .................................. 134/2; 134/3; 134/26;
134/28; 134/30; 134/33; 134/41; 134/95.2;
134/95.3; 134/102.1; 134/153; 134/902
[58] Field of Search .............................. 134/2, 3, 26, 28,
134/30, 33, 41, 153, 95.2, 95.3, 102.1,
902

[56] References Cited

U.S. PATENT DOCUMENTS

| | | | |
|---|---|---|---|
| 4,027,686 | 6/1977 | Shortes et al. | 134/30 |
| 4,871,417 | 10/1989 | Nishizawa et al. | 156/640 |
| 5,248,380 | 9/1993 | Tanaka | 134/33 |
| 5,351,360 | 10/1994 | Suzuki et al. | 15/302 |
| 5,372,652 | 12/1994 | Srikrishnan et al. | 134/33 |
| 5,456,758 | 10/1995 | Menon | 134/33 |
| 5,558,110 | 9/1996 | Williford, Jr. | 134/153 |

FOREIGN PATENT DOCUMENTS 7-37855  2/1995  Japan .

*Primary Examiner*—Randy Gulakowski
*Assistant Examiner*—S. Carrillo
*Attorney, Agent, or Firm*—Oblon, Spivak, McClelland, Maier & Neustadt, P.C.

[57] ABSTRACT

A method for washing and drying a substrate includes the steps of (a) disposing a substrate on a spin chuck such that a surface to be treated faces upward, (b) applying a washing solution from a first nozzle to the surface of the substrate while rotating the substrate disposed on the spin chuck so as to cleanse the surface, and (c) blowing a gas from a second nozzle against the surface while rotating the substrate and moving the second nozzle above the substrate in a radial direction from a central portion toward a peripheral portion of the substrate, thereby drying the surface of the substrate.

12 Claims, 13 Drawing Sheets

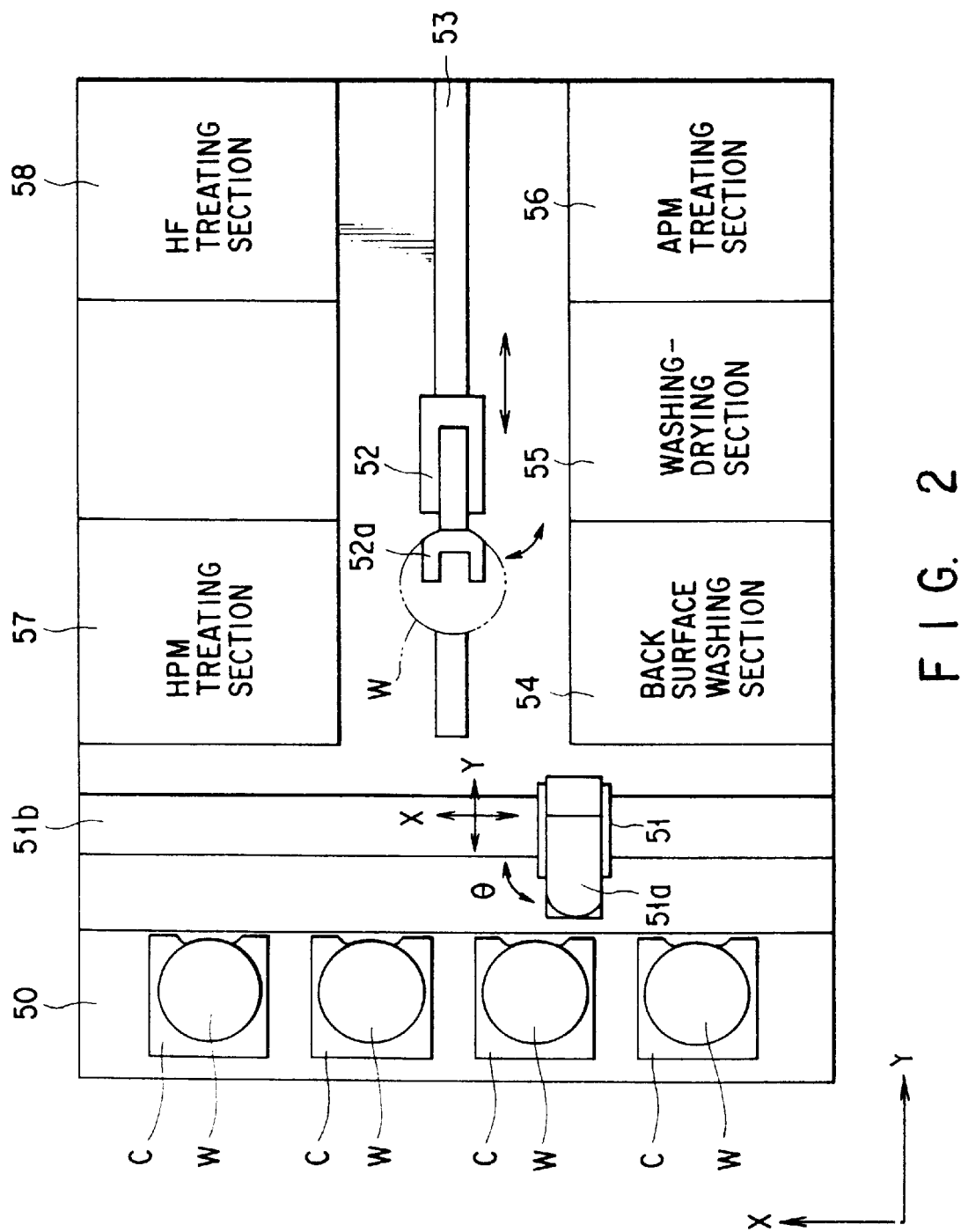
F I G. 2

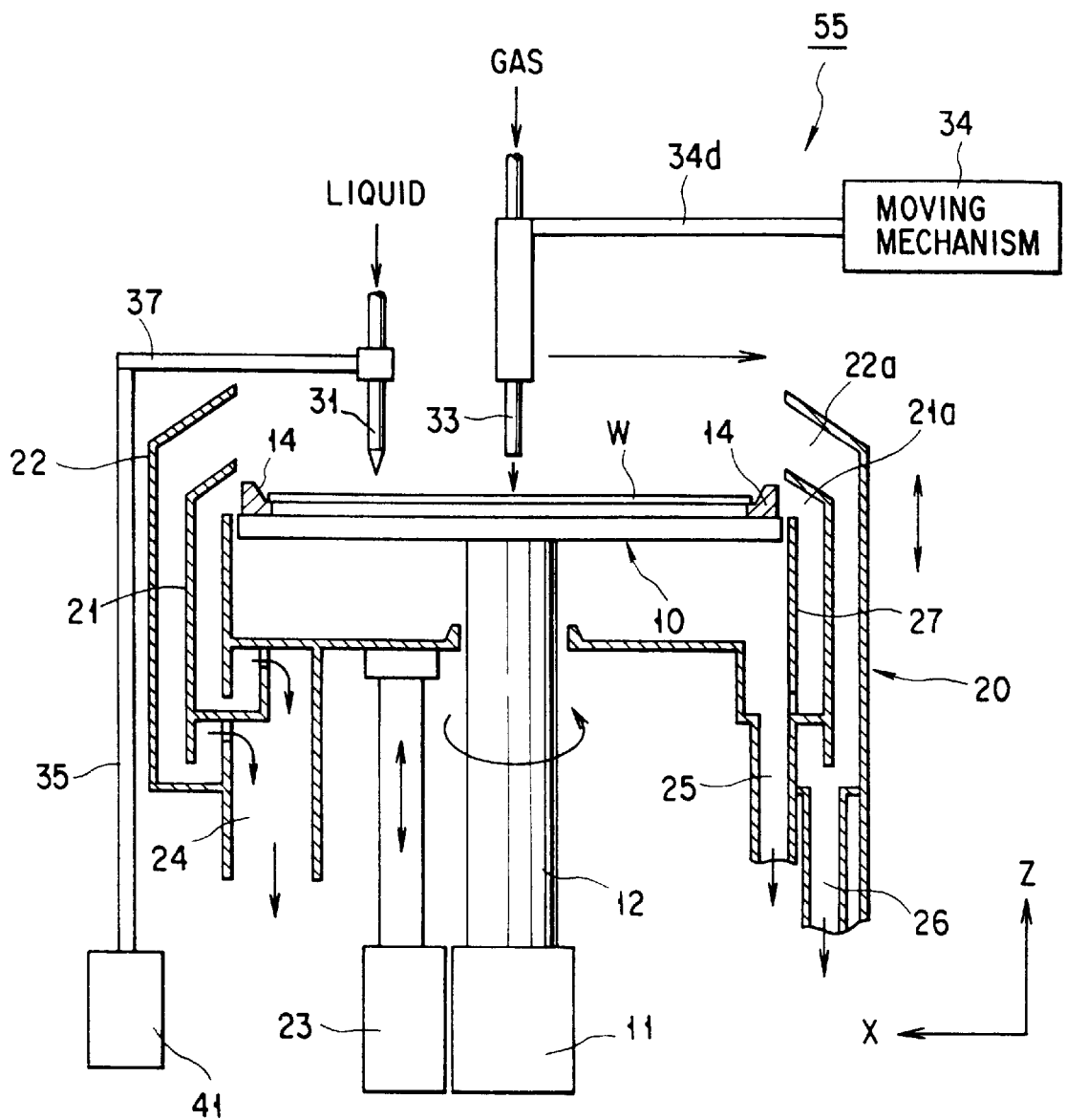
F I G. 3

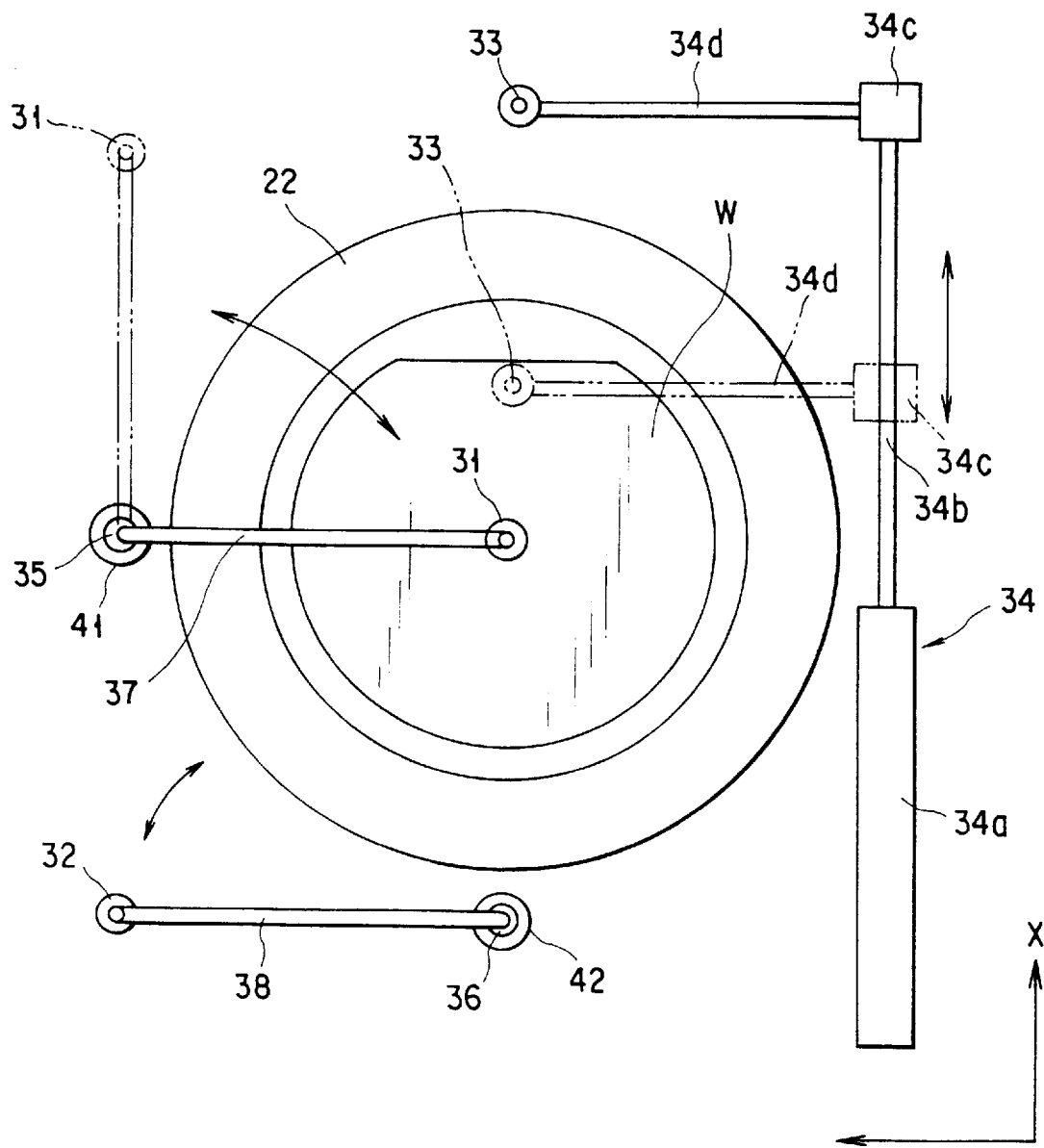
F I G. 4

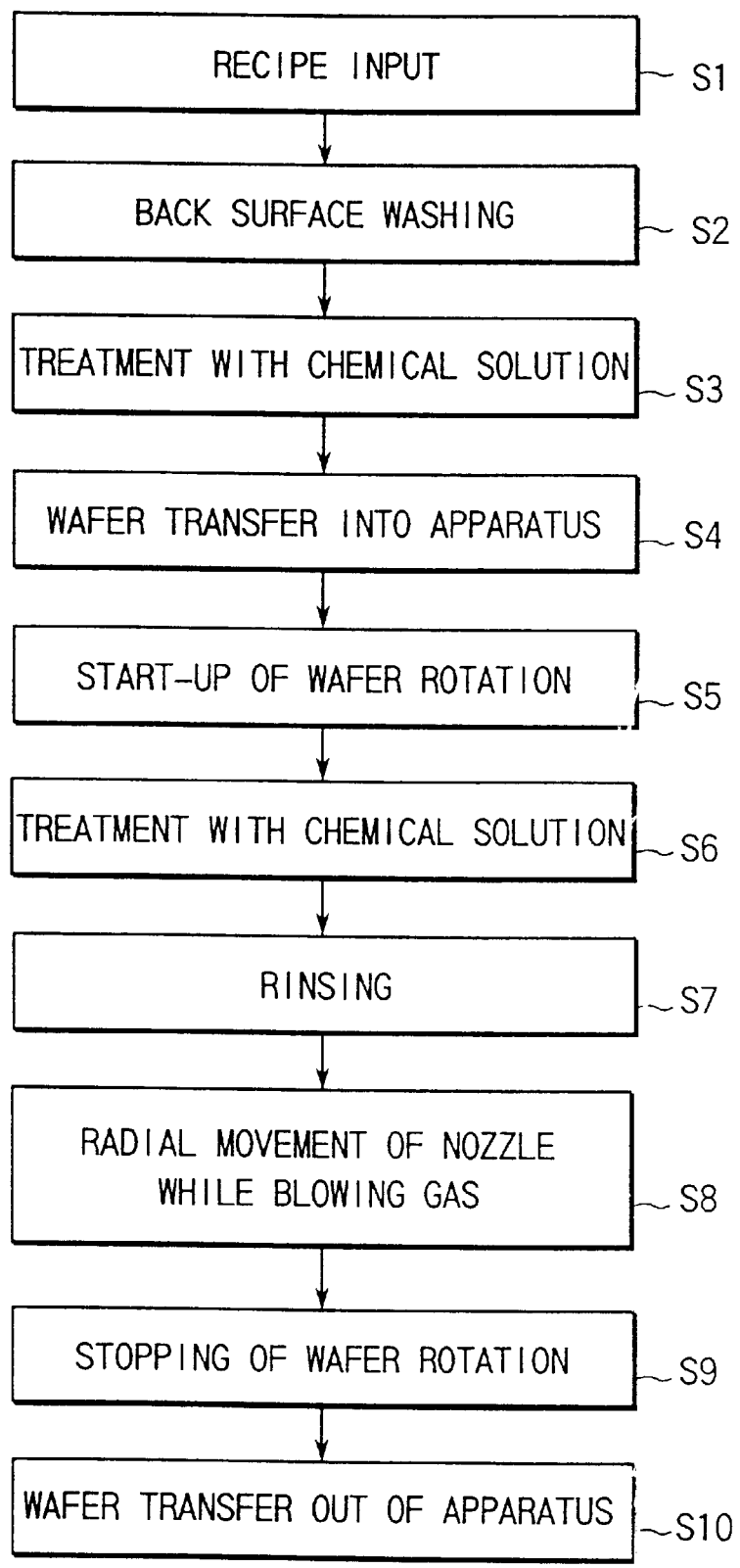
F I G. 8

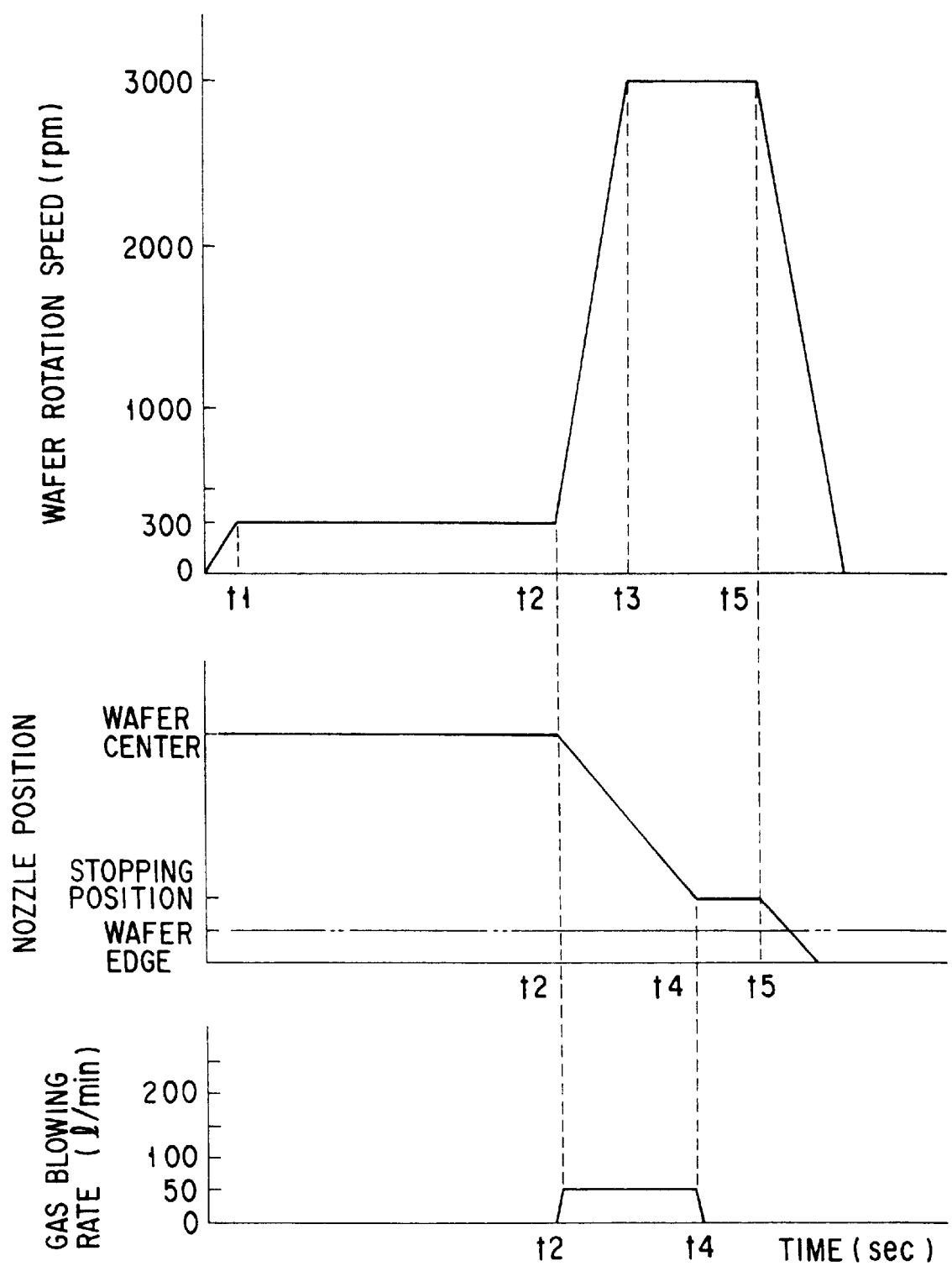
F I G. 9

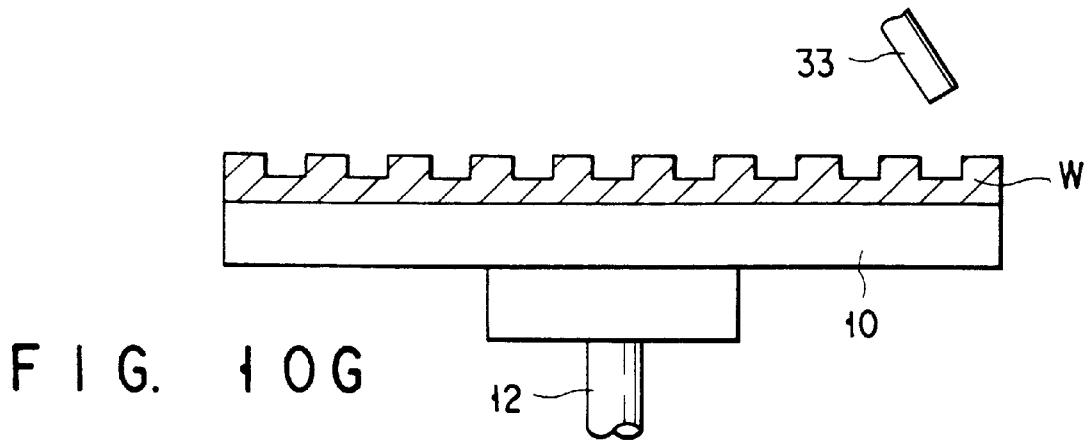
FIG. 10G
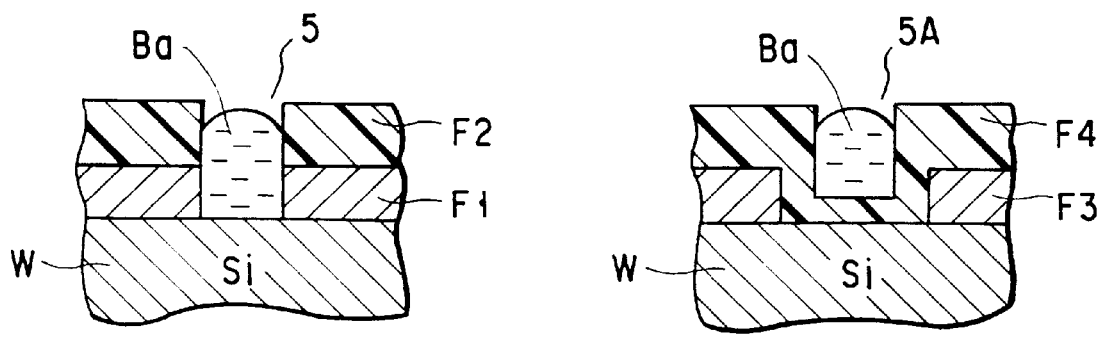
FIG. 11
PRIOR ART
FIG. 12
PRIOR ART
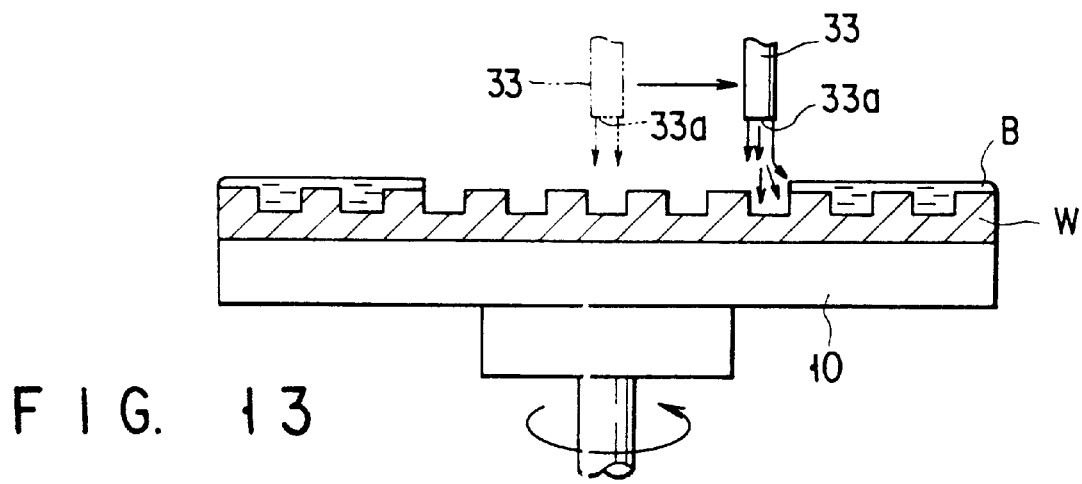
FIG. 13

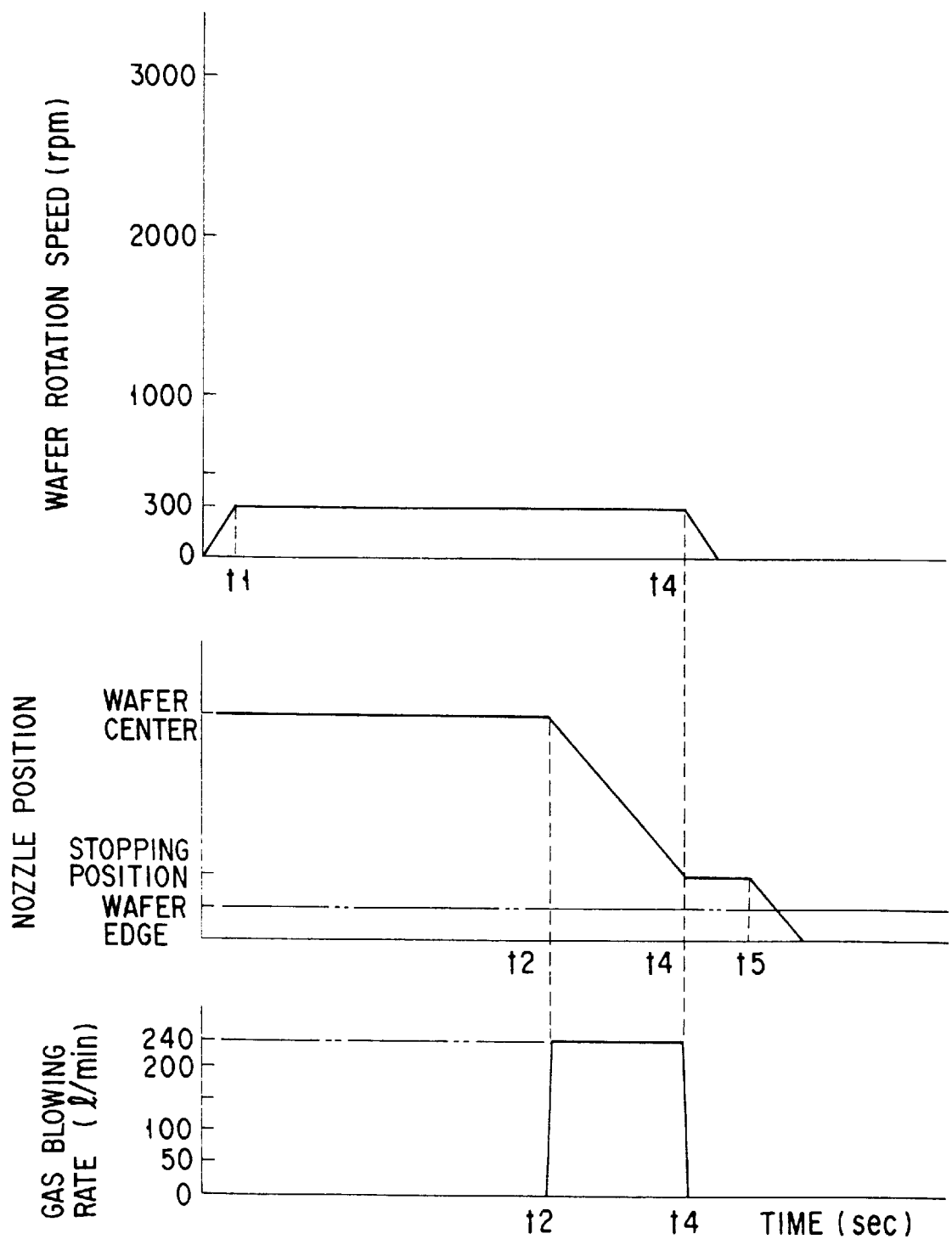
F I G. 1 4

METHOD FOR WASHING AND DRYING SUBSTRATES

BACKGROUND OF THE INVENTION

The present invention relates to a method and apparatus for washing and drying a substrate such as a semiconductor wafer or a substrate for a liquid crystal display (LCD) device, in which a washing solution is applied to the substrate which is kept rotated on its own axis for the washing purpose.

In the manufacture of a semiconductor device, a washing treatment is applied in general to a substrate for removing particles attached to the surface thereof and a spontaneous oxide film formed on the substrate surface as a result of contact of the substrate surface with the air. A one-by-one type washing method in which substrates are washed one by one using a spin type washing device is known to the art as a method of washing a substrate. In the spin type washing system, a chemical solution, e.g., hydrofluoric acid solution, is applied to the surface of a substrate while rotating the substrate on its own axis, followed by washing the substrate with a washing solution, e.g., pure water. Further, the substrate is rotated at a high speed so as to centrifugally remove the liquid material from the substrate.

FIGS. 1A to 1D collectively show a conventional washing-drying method. In the first step, a wafer W is held by a spin chuck 1. Under this condition, a hydrofluoric acid solution A is applied from a nozzle 2 onto the wafer W while rotating the wafer W, as shown in FIG. 1A. Then, a pure water B is applied from a nozzle 3 to the wafer W while rotating the wafer W, as shown in FIG. 1B. In this step, the pure water B partly remains in an irregular surface region of the wafer W to form water droplets Ba, as shown in FIG. 1C. After drying, water marks 4 are formed in the portions where the water droplets Ba were formed previously, as shown in FIG. 1D. It should be noted that traces of foreign substances contained in the water droplets Ba are precipitated on the substrate surface and left on the substrate surface after drying to form "water mark" noted above. In general, the water mark represents a thin film-like foreign substance consisting of silicon-based oxides. These water marks are counted, and the number of counts provides an index denoting the grade of drying state of the substrate.

The mechanism of the water mark formation is considered to be as follows. Specifically, the volume of water B attached to the wafer W is gradually decreased as a result of evaporation to form finally a spherical water droplet Ba. The spherical water droplet Ba thus formed reacts with oxygen and silicon to form $H_2SiO_3$ which is to be precipitated. Alternatively, traces of silica ($SiO_2$) contained in the pure water B is precipitated, leading to formation of the water mark 4. Particularly, where a hydrofluoric acid solution is used as a washing solution, the spontaneous oxide film of SiO2 covering the surface of the wafer W is removed so as to expose the silicon wafer itself to the outside, with the result that the above-noted reaction leading to the water mark formation is likely to take place easily.

FIGS. 11 and 12 show more specifically the mechanism of the water mark formation. FIG. 11 shows that a hydrophilic thin film F1 formed on a silicon wafer W is patterned, followed by forming a hydrophobic thin film F2 such as a polycrystalline silicon film on the thin film F1. Likewise, FIG. 12 shows that a hydrophilic thin film F3 formed on a silicon wafer W is patterned, followed by forming a hydrophobic thin film F4 on the thin film F3. In these cases, water droplets Ba tend to remain in the concavities (contact holes) 5, 5A of the hydrophobic thin films F2, F4. Since it is difficult to remove these water droplets Ba remaining in the concavities 5, 5A, a large number of water marks 4 are formed on the surface of the silicon wafer W as shown in, for example, FIGS. 15B and 15C.

BRIEF SUMMARY OF THE INVENTION

An object of the present invention is to provide a method and apparatus for washing and drying a substrate, which permits washing a substrate with a chemical solution and, drying the substrate without forming water marks on the chemically treated substrate surface, i.e., the substrate surface subjected previously to washing with the chemical solution.

Japanese Patent Disclosure (Kokai) No. 7-37855 discloses a drying method in which a non-oxidizing gas such as a nitrogen gas is blown against a central portion of a substrate which is rotated about its own axis so as to remove a washing solution attached to the substrate surface. In this drying method, however, the peripheral portion of the substrate tends to fail be dried completely, though the central portion is certainly dried completely. Particularly, where a patterned thin film having concavities such as contact holes is formed on the surface of the substrate, the blown gas fails to remove completely the residual washing solution from the peripheral portion of the substrate. It should also be noted that, with increase in the wafer size, it is made more difficult to dry completely the entire region of the wafer without bringing about the water mark formation. Under the circumstances, the present inventors have conducted an extensive research in an attempt to develop a technique for completely drying a chemically treated substrate surface, i.e., a substrate surface treated in advance with a chemical solution, arriving at the present invention.

According to an aspect of the present invention, there is provided a method for washing and drying a substrate, comprising the steps of (a) disposing a substrate on a spin chuck such that a surface to be treated faces upward, (b) applying a washing solution from a first nozzle to the surface of the substrate while rotating the substrate disposed on the spin chuck so as to cleanse the surface, and (c) blowing a gas from a second nozzle against the surface while rotating the substrate and moving the second nozzle above the substrate in a radial direction from a central portion toward a peripheral portion of the substrate so as to remove the liquid material from the surface.

According to another aspect of the present invention, there is provided an apparatus for washing and drying a substrate, comprising a spin chuck capable of rotatably supporting a substrate such that a surface to be treated faces upward, a first nozzle for supplying a washing solution to the surface of the substrate, a second nozzle for blowing a gas against the surface and a moving mechanism for moving the second nozzle above the substrate in a radial direction from a central portion toward a peripheral portion of the substrate.

In the present invention, a gas is blown against a substrate while moving the gas-blowing nozzle in a radial direction from a central portion toward a peripheral portion of the substrate. In addition, the substrate is kept rotated during movement of the nozzle. What should be noted is that a synergetic effect is produced by the blowing force of the gas and the centrifugal force acting on the substrate, with the result that the liquid material is removed without fail from the substrate. It follows that the dried substrate is substantially free from precipitation of silica or a reaction product such as $H_2SiO_3$ from the residual liquid material, e.g., washing water such as pure water. Particularly, where a patterned thin film is formed on the chemically treated substrate surface, i.e., a substrate surface treated previously with a chemical solution, a liquid material is promptly removed from the concavities of the thin film so as to prevent the water mark formation. The patterned thin film noted above includes, for example, a silicon oxide film, a silicon nitride film, and a polycrystalline silicon film. Also, the thin film may not be formed on the chemically treated surface of the substrate. In other words, it is possible to blow the gas from the second nozzle against the substrate surface flattened in advance by a chemical mechanical polishing.

In step (c) of the method of the present invention, it is desirable to move the second nozzle in a radial direction of the substrate, while accelerating the rotating speed of the substrate, for blowing a gas against the chemically treated surface of the substrate. It is more desirable to start up the radial movement of the second nozzle in synchronism with initiation of acceleration of the substrate rotation and to stop acceleration of the substrate rotation during the radial movement of the second nozzle. Further, it is desirable to start up the radial movement of the second nozzle in synchronism with initiation of acceleration of the substrate rotation and to stop the radial movement of the second nozzle while the substrate is rotated at a constant speed after accelerated to reach a maximum rotation speed.

Also, in step (c) noted above, it is possible to blow a gas from the second nozzle against the chemically treated surface of the substrate while moving the second nozzle in a radial direction of the substrate and rotating the substrate at a substantially constant rotation speed. It is also possible to stop the radial movement of the second nozzle at a point somewhat inward of an outer periphery of the substrate. It is also possible to move the second nozzle in a radial direction of the substrate such that a gas blowing port of the second nozzle is inclined relative to the chemically treated surface of the substrate so as to blow a gas in a moving direction of the second nozzle. Further, it is possible to blow at least one kind of a gas selected from the group consisting of a nitrogen gas, a carbon dioxide gas, an argon gas, a helium gas and the air against the chemically treated surface of the substrate. Still further, it is desirable to blow a gas cooled to 2 to 10° C. against chemically treated surface of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 2 is a plan view schematically showing a washing-drying system of a semiconductor wafer;

FIG. 3 is a cross sectional view showing a washing-drying apparatus of a substrate according to one embodiment of the present invention;

FIG. 4 is a plan view schematically showing the construction of a nozzle moving mechanism included in the washing-drying apparatus of the present invention;

FIG. 8 shows the process steps included in the washing-drying method of the present invention;

FIG. 9 is a timing chart showing the washing-drying method of a substrate according to the present invention;

FIGS. 10A to 10G are cross sectional views collectively showing a washing-drying method of a substrate according to the present invention;

FIG. 11 is a cross sectional view showing in a magnified fashion how a water droplet conventionally remains in a concavity extending through thin films formed on a wafer;

FIG. 12 is a cross sectional view showing in a magnified fashion how a water droplet conventionally remains in a concavity of a thin film formed on a wafer;

FIG. 13 is a cross sectional view schematically showing a gas-blowing nozzle used in a washing-drying method according to another embodiment of the present invention;

FIG. 14 is a timing chart showing a washing-drying method of a substrate according to another embodiment of the present invention;

DETAILED DESCRIPTION OF THE INVENTION

Figures 1A, 1B, 1C, 1D:
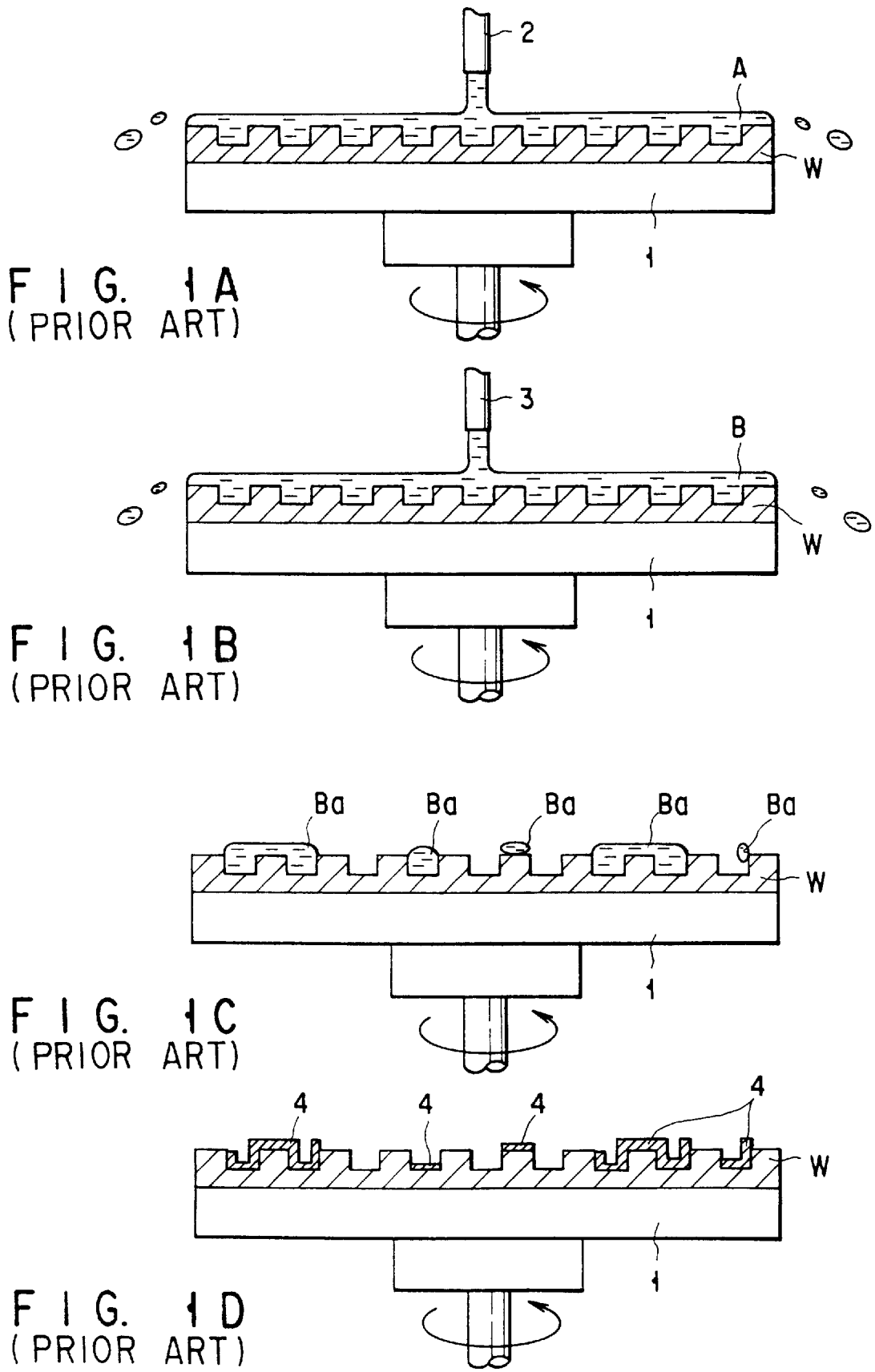
FIGS. 1A to 1D collectively show a conventional method for washing and drying a substrate.

Let us describe preferred embodiments of the present invention with reference to the accompanying drawings.

As shown in FIG. 2, a washing-drying system for a semiconductor wafer includes a cassette section 50, a sub-arm mechanism 51, a main arm mechanism 52, transfer paths 51b, 53, and a plurality of process sections 54 to 58, i.e., a back surface washing section 54, a washing-drying section 55, an AMP treating section 56, an HMP treating section 57, and a hydrofluoric acid treating section 58. Cassettes C are transferred by a transfer robot (not shown) into and out of the cassette section 50. Four cassettes C each housing, for example, 25 wafers W are arranged in an X-axis direction on a table in the cassette section 50.

As shown in FIG. 11, patterned thin films F1 and F2 are formed on the surface of the wafer W. FIG. 12 shows another example in which patterned thin films F3 and F4 are formed on the wafer surface. These patterned thin films F1, F2, F3, F4 denote a silicon oxide film, a silicon nitride film, a polycrystalline silicon film, etc. formed previously in another processing system (not shown). Contact holes 5, 5A are formed in these patterned thin films F1, F2, F3, F4.

The sub-arm mechanism 51 is arranged between the cassette section 50 and the process sections 54 to 58 so as to deliver and receive the wafer W to and from the main arm mechanism 52. The sub-arm mechanism 51 comprises an arm portion 51a, a driving section (not shown) for moving the arm portion 51a back and forth, another driving section (not shown) for swinging the arm portion 51a about a Z-axis by an angle θ, and still another driving section (not shown) for moving the arm portion 51a along the transfer path 51b in an X-axis direction. On the other hand, the main arm mechanism 52 comprises an arm portion 52a, a driving section (not shown) for moving the arm portion 52a back and forth, another driving section (not shown) for swinging the arm portion 52a about a Z-axis by an angle θ, another driving section (not shown) for moving the arm portion 52a along the main transfer path 53 in a Y-axis direction, and still another driving section (not shown) for vertically moving the arm portion 52a in a Z-axis direction. The driving sections for the main arm mechanism 52 and the sub-arm mechanism 51 are controlled by a control section 40 shown in FIG. 5.

Arranged on one side of the main transfer path 53 are the back surface washing section 54, the washing-drying section 55 and the AMP treating section 56. On the other hand, the HMP treating section 57 and the hydrofluoric acid treating section 58 are arranged on the other side of the main transfer path 53.

Figure 5:
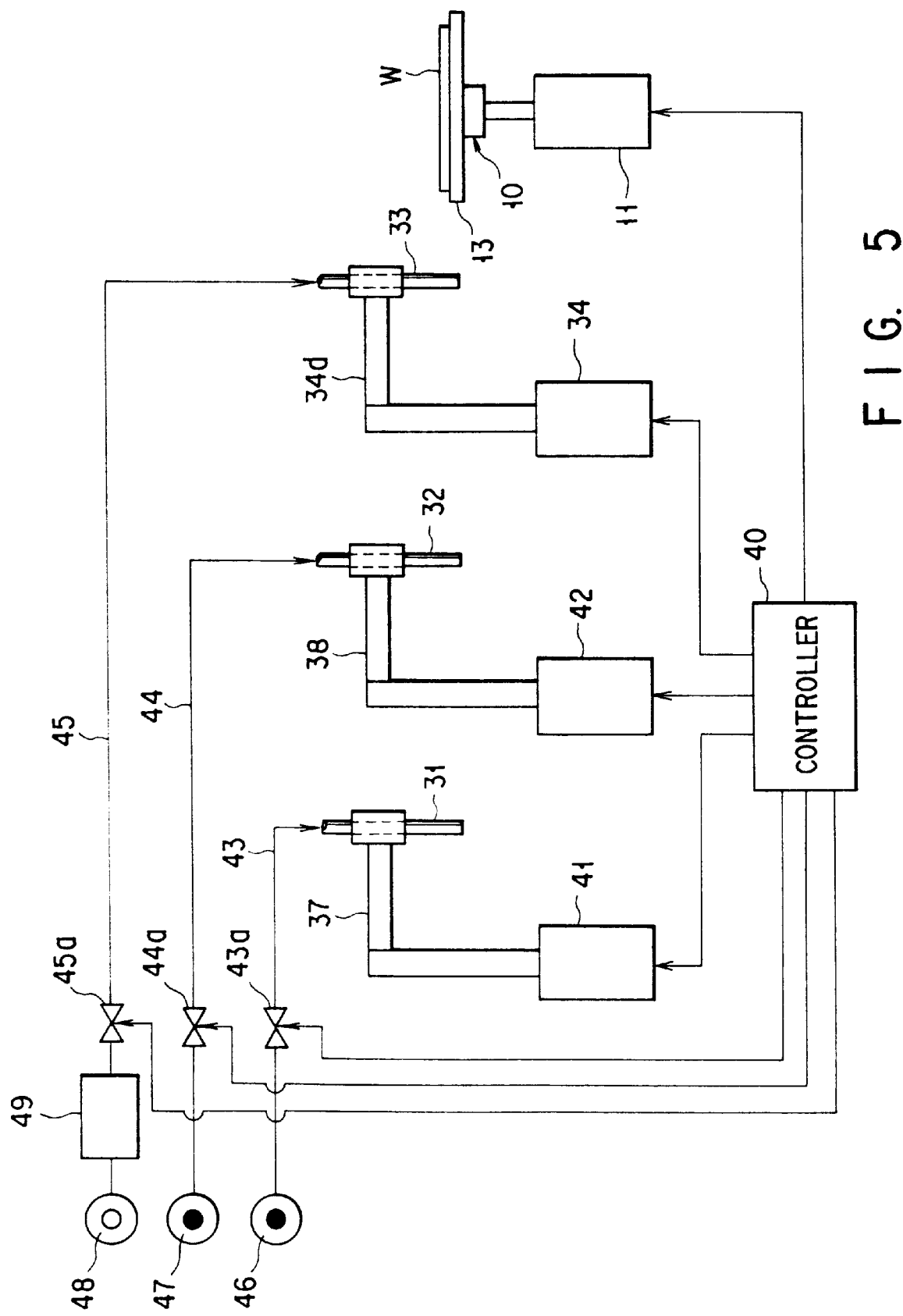
FIG. 5 is a circuit diagram showing the washing-drying apparatus of the present invention.

The washing-drying section 55 is shown in detail in FIGS. 3 to 7. As shown in FIGS. 3 to 5, the washing-drying section 55 comprises a spin chuck 10, a cup 20 and three nozzles 31, 32, 33. The spin chuck 10 includes holding mechanisms 14, 15 for mechanically holding the wafer W and a motor 1 for rotating the wafer W. The cup 20 surrounds the spin chuck 10 and the periphery of the wafer W. The first nozzle 31 communicates with a supply source 46 of a hydrofluoric acid solution via a supply line 43. The second nozzle 32 communicates with a pure water supply source 47 via a supply line 44. Further, the third nozzle 33 communicates with a nitrogen gas supply source 48 via a supply line 45.

Flow rate control valves 43a, 44a and 45a are mounted to the supply lines 43, 44 and 45, respectively. These control valves 43a, 44a, 45a are controlled by the control section 40. It should be noted that a cooling device 49 is mounted to the supply line 45 so as to cool the nitrogen gas, which is to be supplied to the third nozzle 33, to about 2° C. to 10° C. Also, various nozzles such as a straight nozzle, a slit nozzle, a double wall nozzle, and a multi-hole nozzle can be used as the third nozzle 33.

Figure 6:
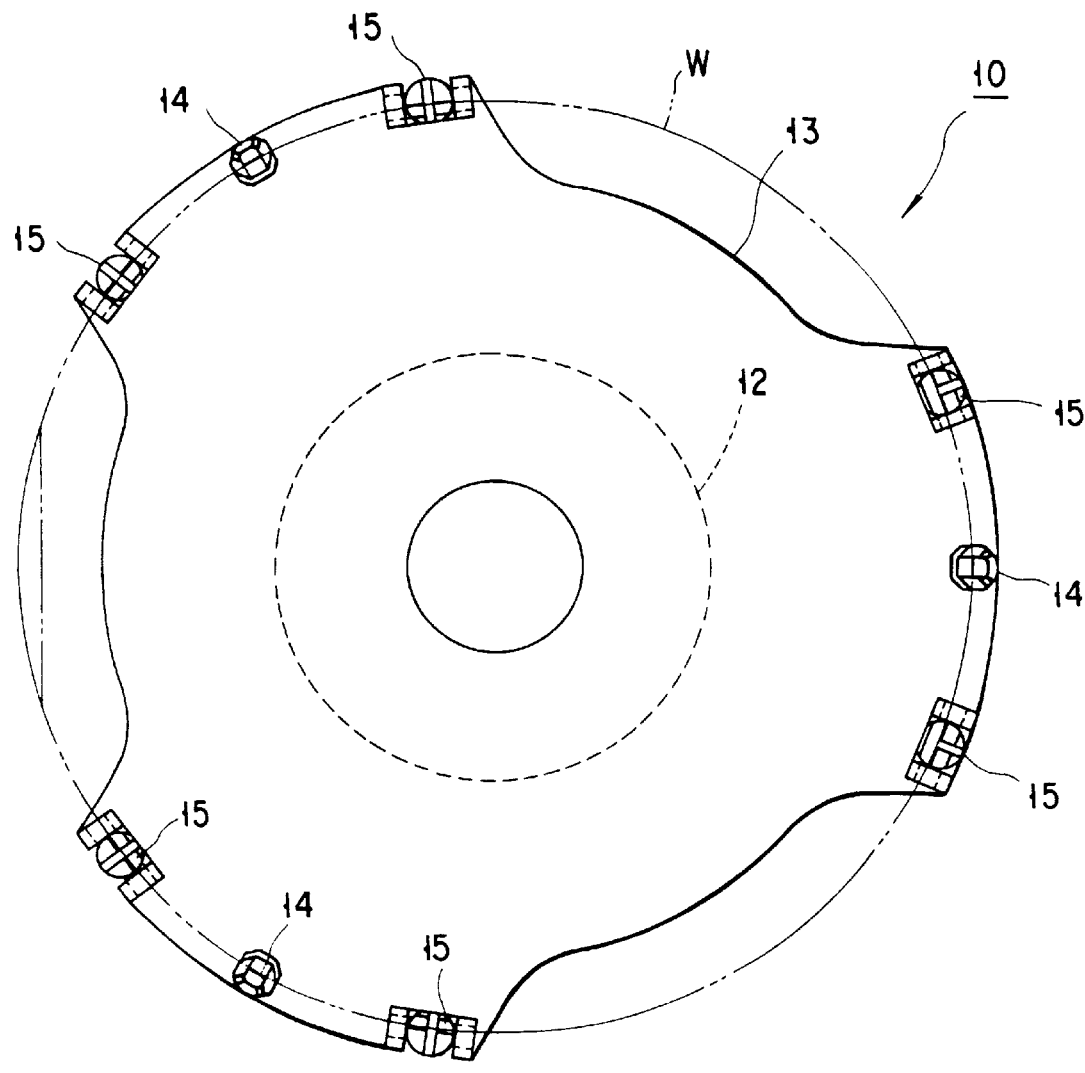
FIG. 6 is a plan view of a spin chuck.
Figure 7:
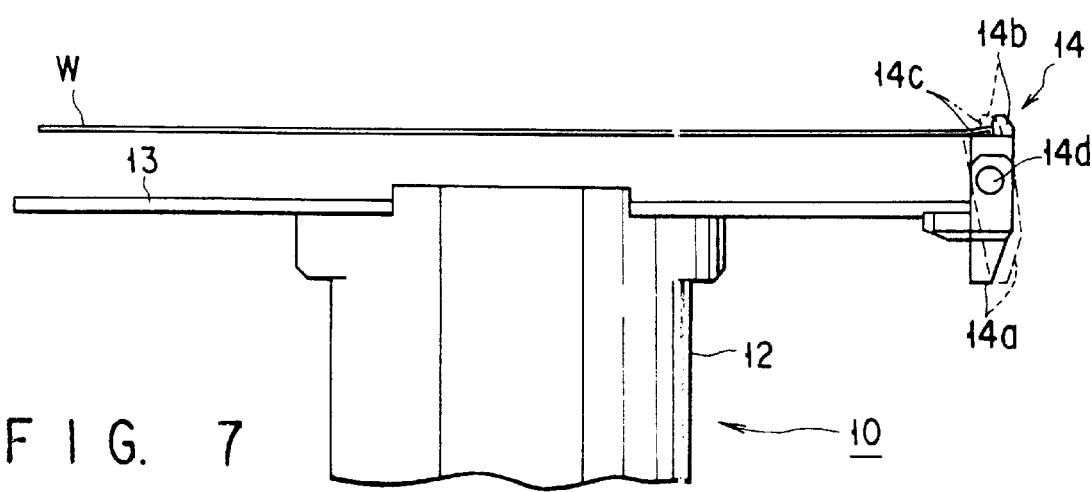
FIG. 7 is a side view of the spin chuck shown in FIG. 6.

As shown in FIGS. 6 and 7, the spin chuck 10 includes a spindle 12. A mounting table 13 is supported by the upper end of the spindle 12. The wafer W is mechanically held by three first holding mechanisms 14 and six second holding mechanisms 15 of the mounting table 13. These six second holding mechanisms 15 are fixed to an outer periphery of the mounting table 13. On the other hand, the three first holding mechanisms 14 are swingably supported by horizontal pivotal shafts 14d at an outer periphery of the mounting table 13. If the spin chuck 10 is rotated, centrifugal force acts on the first holding mechanism 14 so as to swing a lower end 14a and an upper end 14b outward and inward, respectively. As a result, an abutting portion 14c is pushed against an outer periphery of the wafer W so as to firmly hold the wafer W. As shown in FIG. 6, the first holding mechanism 14 is interposed between a pair of second holding mechanisms 15. Also, a peripheral portion of the mounting table 13 is locally recessed in regions where the holding mechanisms 14, 15 are not mounted.

As shown in FIG. 3, the cup 20 has a double cup structure including an inner cup 21 having a receiving port 21a and an outer cup 22 having a receiving port 22a and is supported by a lift mechanism 23 so as to be movable in a vertical direction. The receiving port 22a of the outer cup 22 is positioned immediately above the receiving port 21a of the inner cup 21. These inner and outer cups 21, 22, which are concentric with each other, communicate with a common exhaust path 24 formed below these cups so as to permit the atmosphere within these cups to be discharged to the outside through the common exhaust path 24. These inner and outer cups 21, 22 also communicate with drain pipes 25, 26, respectively, formed below these cups so as to permit the waste solution to be discharged to the outside through these drain pipes 25, 26. Further, a receiving cup 27 is formed inside the inner cup 21 in a manner to surround a lower region of the spin chuck 10. The liquid accumulated within the receiving cup 27 is discharged to the outside through the drain pipe 25. A chemical solution (hydrofluoric acid solution) and a washing solution (pure water) are received separately by the inner cup 21 and the outer cup 22 so as to be discharged to the outside separately for recovery.

As shown in FIG. 4, the first nozzle 31 is supported at a tip of a horizontal arm 37, which is joined to a vertical driving shaft 35 of a motor 41 arranged outside the cup 20. The second nozzle 32 is supported at a tip of a horizontal arm 38, which is joined to a vertical driving shaft 36 of a motor 42 arranged outside the cup 20. It follows that these first and second nozzles 31, 32 can be swung about the shafts 35, 36, respectively, so as to be moved from outer positions (home positions) of the cup 20 toward a central position (working position) of the spin chuck 10.

The third nozzle 33 is mounted to a tip of a horizontal arm 34d of an air cylinder mechanism (third nozzle moving mechanism) 34 having a cylinder 34a positioned outside the cup 20. The horizontal arm 34d is joined to a rod 34b of the cylinder 34a. If the rod 34b is projected out of the cylinder 34a, the third nozzle 34 is moved to reach the home position outside the cup 20. On the other hand, if the rod 34d is retreated into the cylinder 34a, the third nozzle 33 is moved to reach the working position in a central portion of the spin chuck 10. Incidentally, an air cylinder mechanism is used for forming the third nozzle moving mechanism 34. Alternatively, a linear driving mechanism such as a belt or a ball screw can be used in the third nozzle moving mechanism. Further, a swingable mechanism similar to the first and second moving mechanisms can be employed in the third nozzle moving mechanism.

FIGS. 8, 9 and 10A to 10G collectively show how to wash and dry the wafer W using the process system described above. In the first step (step S1), a recipe predetermined in accordance with the kind of the thin film to be processed is stored in the memory of the control section 40. Then, the cassette C is transferred into the cassette section 50 for detecting a wafer W. When the detected information is supplied to the control section 40, processing of the wafer W is started. Specifically, the sub-arm mechanism 51 takes the wafer W out of the cassette C and delivers the wafer W to the main arm mechanism 52. Then, the wafer W is transferred by the main arm mechanism 52 into the back surface washing section 54 for washing of the back surface of the wafer W by means of a pure water spraying (step S2). Further, the wafer W is transferred into the APM treating section 56 for removing particles from the surface of the substrate W by means of spraying of an APM solution (step S3). The term "APM solution" noted above denotes a mixed solution of ammonia, hydrogen peroxide and pure water. Still further, the wafer W is transferred into the HPM treating section 57 for removing metal ions from the surface of the wafer W by means of spraying of an HPM solution (step S3). The term "HPM solution" denotes a mixed solution of hydrochloric acid, hydrogen peroxide and pure water.

After the treatment with chemical solutions (APM solution and HPM solution), the wafer W is transferred by the main arm mechanism 52 into the hydrofluoric acid treating section 58 such that the wafer W is disposed on the spin chuck 10 (step S4), followed by rotating the spin chuck 10 at a rotating speed of, for example, 300 rpm at time $t_1$ shown in FIG. 9 (step S5). Under this condition, the first nozzle 31 is moved from the home position to the working position so as to spray a 0.5% hydrofluoric acid solution A toward a central portion of the wafer W at a rate of, for example, 1,000 mL (milli liter)/min. The solution A is kept sprayed for about 1 minute so as to remove a spontaneous oxide film (very thin silicon oxide film) from the surface of the wafer W (step S6). In this step, the cup 20 is moved upward so as to permit the inner cup 21 to receive through the receiving port 21a the hydrofluoric acid solution A centrifugally separated from the wafer W. The solution A thus received is recovered through the drain pipe 25.

Figure 10A:
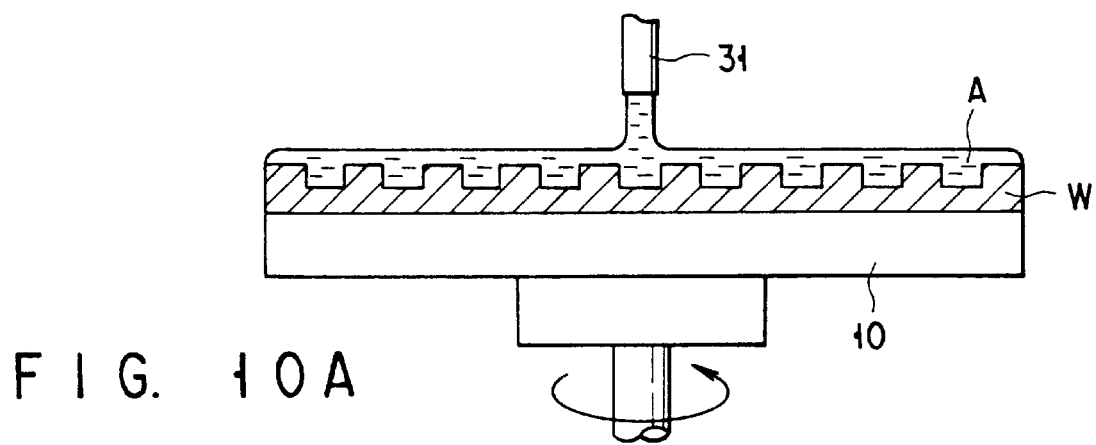
Figure 10B:
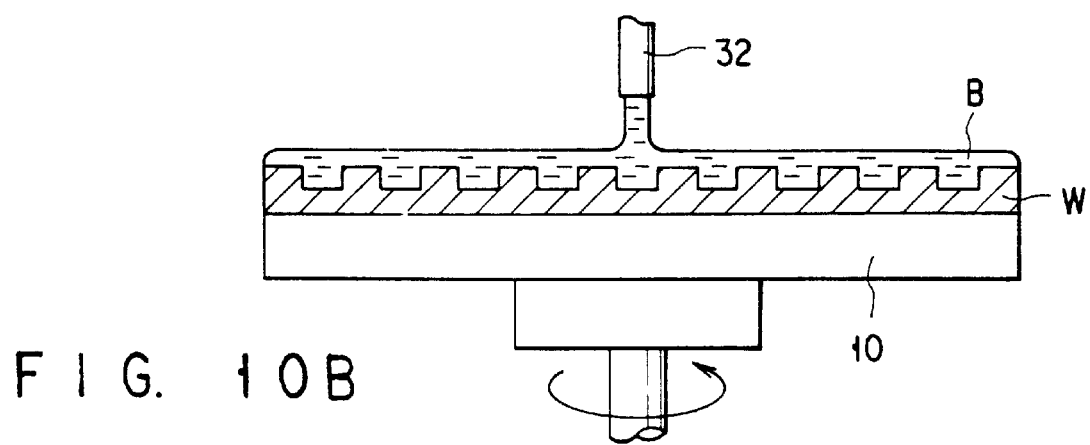

Then, the first nozzle 31 is brought back to the home position. Also, the second nozzle 32 is moved from the home position to the working position so as to spray pure water B toward a central portion of the wafer W for the rinsing purpose, as shown in FIG. 10B. The pure water B is kept sprayed for about one minute at a rate of, for example, 1,000 mL/min (step S7). In this step, the cup 20 is moved downward to permit the waste water centrifugally separated from the wafer W to be received by the outer cup 22 through the receiving port 22a. The waste water thus received is discharged to the outside through the drain pipe 26.

Figure 10C:
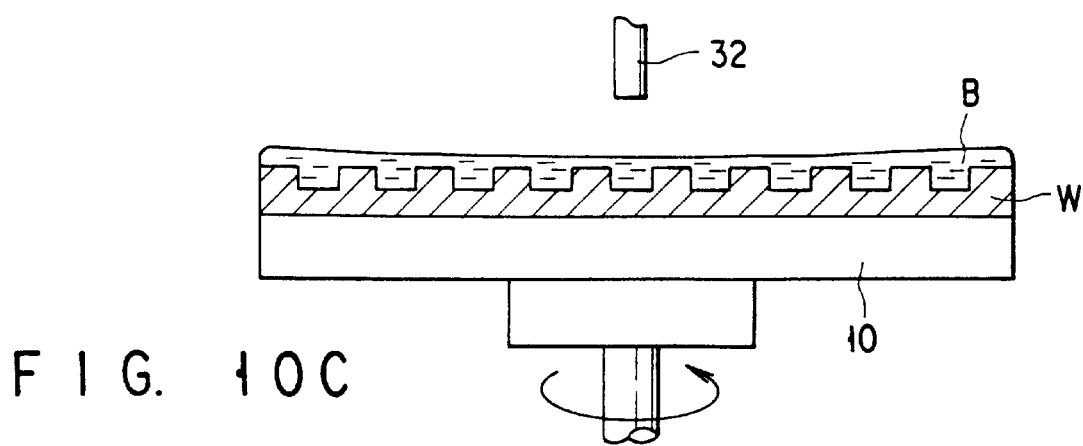
Figure 10D:
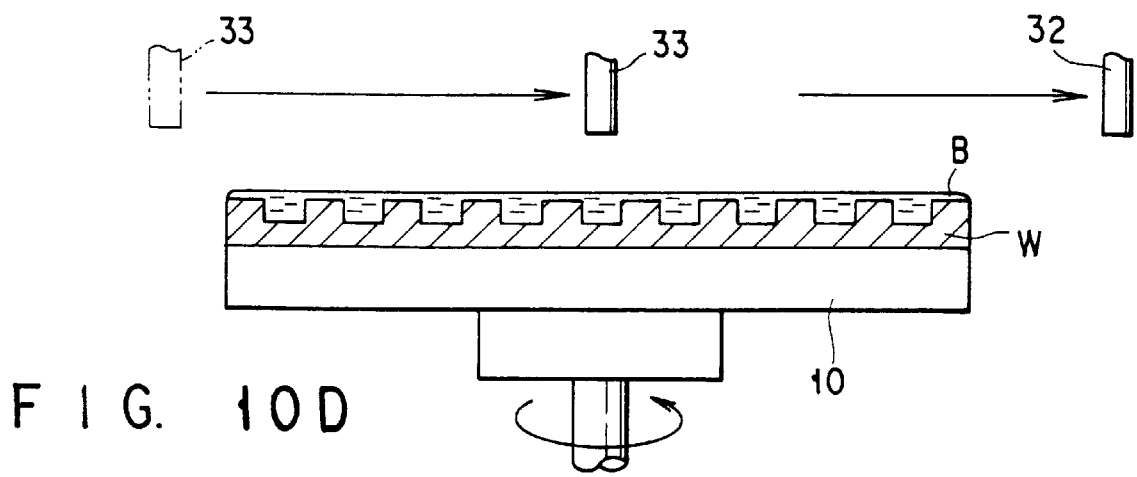

Then, the pure water supply from the second nozzle 32 to the wafer W is stopped at time $t_2$ shown in FIG. 9, as shown in FIG. 10C, followed by moving the second nozzle 32 back to the home position, as shown in FIG. 10D. At the same time, the third nozzle 33 is moved to the working position. It should be noted that the wafer W is kept rotated at a speed of 300 rpm during the washing step S6 using the hydrofluoric acid solution A and the subsequent rinsing step S7 using the pure water B, i.e., during the period between time $t_1$ and time $t_2$ shown in FIG. 9.

Figure 10E:
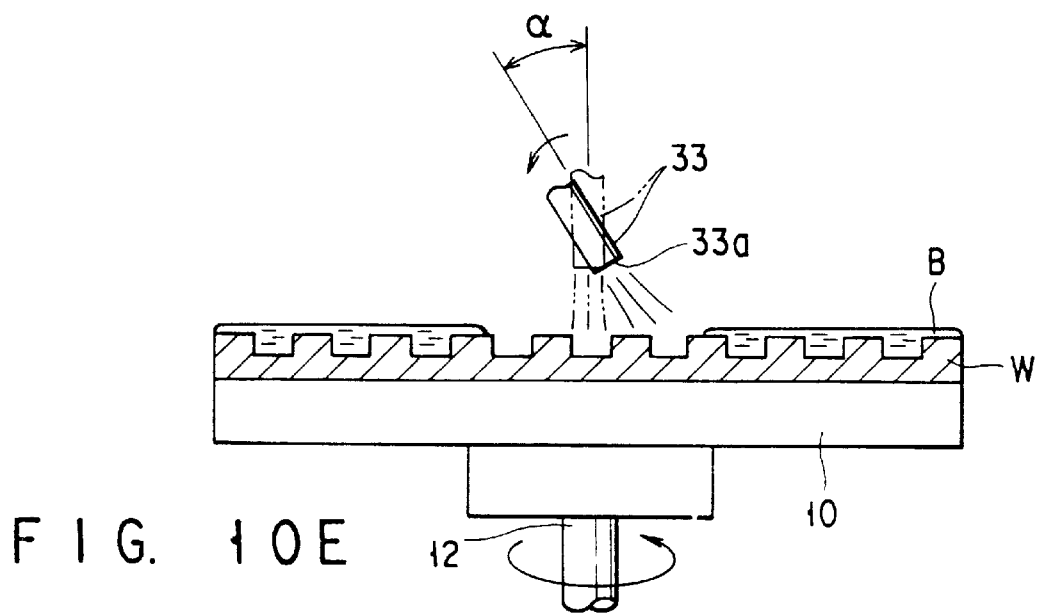

After the rinsing step S7, a nitrogen gas is blown from the third nozzle 33 against a central portion of the wafer W, as shown in FIG. 10E. In this step, the third nozzle 33 is inclined by an angle α, which is about 15°, and the nitrogen gas is blown from the third nozzle 33 at a rate of about 50 L/min. The nitrogen gas blowing rate should desirably be 50 to 240 L/min. Also, the angle α of inclination should desirably be 5° to 45°.

Figure 10F:
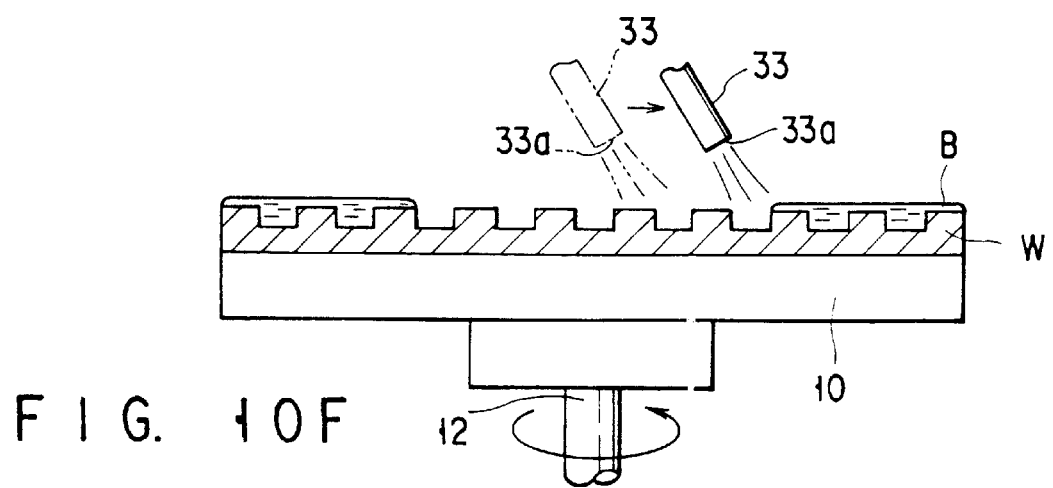

The third nozzle 33 is moved in a radial direction of the wafer W from a central portion toward the periphery of the wafer W, as shown in FIG. 10F (step S8). During the movement, a nitrogen gas is kept blown from a gas blowing port 33a of the third nozzle 33. The third nozzle 33 should desirably be moved in a radial direction of the wafer W at a speed of 20±5 mm/sec. Also, the gas blowing port 33a of the third nozzle 33 should desirably be apart from the wafer surface by 10 to 20 mm. Further, the diameter of the gas blowing port 33a should desirably be 4 to 16 mm. Incidentally, it is possible to move the third nozzle 33 in a radial direction of the wafer W without inclining the gas blowing port 33a such that the nitrogen gas is blown vertically downward against the wafer surface, as shown in FIG. 13.

During movement of the third nozzle 33 toward a periphery of the wafer W, the rotation speed of the wafer W is increased from 300 rpm at time $t_2$ to reach 3,000 rpm at time $t_3$ at an acceleration of 1,000 rpm/sec, as shown in FIG. 9.

The acceleration is started substantially simultaneously with start-up time $t_2$ of the radial movement of the third nozzle 33. The rotation speed of the wafer W is increased to reach 3,000 rpm before the third nozzle 33 is stopped at time $t_4$ at a point somewhat inward of the outermost periphery of the wafer W.

The rotating speed of the wafer W is kept constant at 3,000 rpm for a predetermined period of time, i.e., between time $t_3$ and time $t_5$. During the constant rotation of the wafer W, the radial movement of the third nozzle 33 is stopped at time $t_4$ intermediate between time $t_3$ and time $t_5$. As shown in FIG. 10G, the third nozzle 33 is stopped about 10 to 20 mm inward of the outermost periphery of the wafer W so as to prevent the blown gas from being spread outside the wafer W. If the nitrogen gas blown from the third nozzle 33 is spread excessively, particles are likely to be scattered by the blown gas.

As described above, the rinsing water B is centrifugally removed from the wafer surface. At the same time, the rinsing water B is removed completely from the wafer surface by the blowing force of the nitrogen gas. Particularly, since the water droplets Ba are removed without fail from within the contact holes 5, 5A by the blowing force of the gas, water marks are not formed on the wafer surface. It follows that the surface of the wafer W is dried completely.

Then, the nitrogen gas blowing from the third nozzle 33 is stopped, and the wafer rotation is stopped (step S9). Further, the third nozzle 33 is brought back to the home position. Under this condition, the wafer W is taken out of the hydrofluoric acid treating section 58 by the main arm mechanism 52 (step S10). The wafer is washed and dried in the washing-drying section 55. The wafer W is further delivered from the main arm mechanism 52 to the sub-arm mechanism 51 and, then, housed in the cassette C by the sub-arm mechanism 51. The series of operations described above are carried out in accordance with the recipe stored in the memory of the control section 40.

Alternatively, it is possible to rotate the wafer W at a constant speed of 300 rpm during the steps S6 to S10, i.e., time $t_1$ to $t_4$, as shown in FIG. 14. It is also possible to blow a nitrogen gas from the third nozzle 33 against the wafer W at a rate of 240 L/min. If the gas is blown at such a high rate against the wafer W rotated at such a low speed, the wafer surface covered with a patterned thin film having deep concavities can be dried completely.

The washing-drying section described above is incorporated in a process system. Of course, the particular washing-drying section can also be used as an independent apparatus.

EXAMPLE AND COMPARATIVE EXAMPLES 1, 2

An 8-inch wafer W covered with thin films F1, F2 as shown in FIG. 11 (a line-and-space pattern having a line width of 0.8 μm) was used in this experiment. In this experiment, the wafer having a surface treated with a hydrofluoric acid solution (50% HF:water=1:10) was rinsed with pure water, followed by drying the wafer as follows:

Example

A nitrogen gas was kept blown for 5 seconds against the wafer surface at a rate of 240 L/min while moving the nozzle for blowing the nitrogen gas in a radial direction of the wafer at a speed of 20 mm/sec. During the drying step, the wafer W was kept rotated (maximum rotation speed of 3,000 rpm).

Figure 15A:
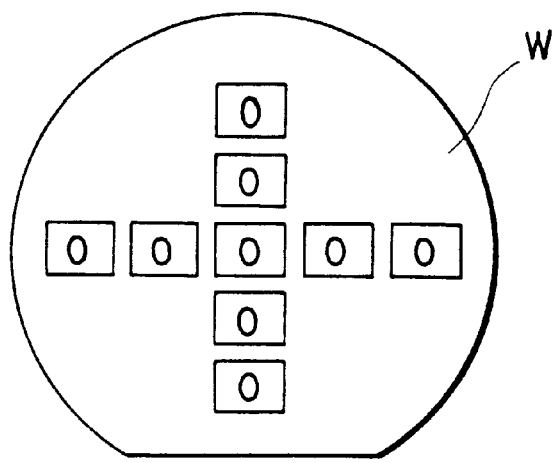
FIG. 15A is a plan view of a substrate showing the evaluation in the case of washing and drying the substrate by the method of the present invention.

After the drying treatment, the number of water marks was counted at 9 points, each sized 5 mm×5 mm, of the wafer W by using a metal microscope manufactured by Olympus Optical Co., Ltd. (magnification of 200: eyepiece ×10; objective ×20). FIG. 15A shows the result. It is seen that a water mark was not formed in any of the counted points.

Comparative Example 1

Figure 15B:
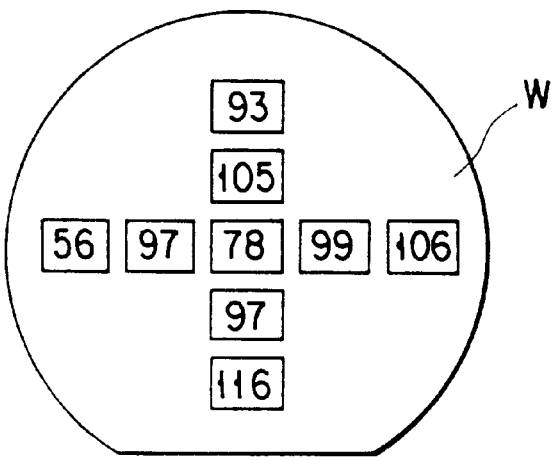
FIG. 15B is a plan view of a substrate showing the evaluation in the case of washing and drying the substrate by a conventional method.

In the drying step, the wafer W was rotated at a maximum rotation speed of 3,000 rpm. However, a gas was not blown against the wafer. After the drying treatment, the number of water marks was counted as in Example of the present invention, with the result as shown in FIG. 15B. A large number of water marks were formed. Specifically, more than 100 water marks were found in 3 of the 9 counting points. Also, the average number of water marks was 94.1/counting point.

Comparative Example 2

Figure 15C:
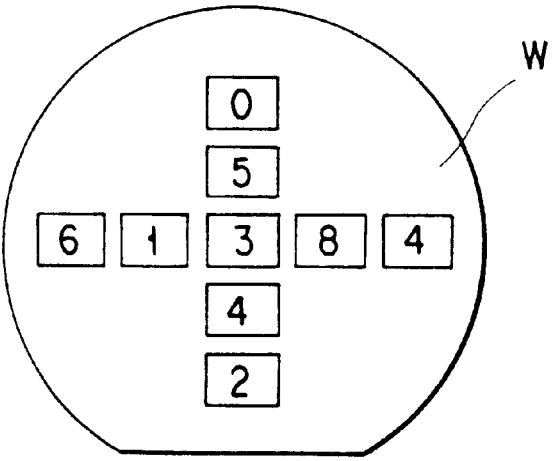
FIG. 15C is a plan view of a substrate showing the evaluation in the case of washing and drying the substrate by another conventional method.

In the drying step, the wafer W was rotated at a maximum rotation speed of 3,000 rpm. Also, a nitrogen gas was blown against the wafer W at a rate of 240 L/min. However, a nozzle for blowing the gas was not moved in a radial direction of the wafer such that the gas was kept blown against a central portion of the wafer. After the drying treatment, the number of water marks was counted as in Example of the present invention, with the result as shown in FIG. 15C. Water marks were formed in a central portion of the wafer W. The average number of water marks was found to be 3.4/counting point.

As described above, the method and apparatus of the present invention make it possible to dry a surface of a substrate completely without giving rise to water marks. Particularly, since a water mark can be eliminated completely over the entire region of a large substrate efficiently and without fail, the product yield can be drastically improved.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method for washing and drying a substrate, the steps of comprising:

disposing the substrate on a spin chuck such that a surface of the substrate to be treated faces upward;

applying a washing solution from a first nozzle to the surface of the substrate while the substrate disposed on the spin chuck rotates; and blowing a gas from a second nozzle to the surface while the substrate disposed on the spin chuck rotates and while the second nozzle moves above the surface in a radial direction of the substrate from a central portion toward a peripheral portion of the substrate, thereby drying the surface of said substrate.

2. The method according to claim 1, wherein a rotational speed of the substrate increases during the blowing step.

3. The method according to claim 1, wherein the second nozzle moves in the radial direction while the substrate rotates at a substantially constant speed during the blowing step.

4. The method according to claim 1, wherein the second nozzle stops moving inside a periphery of the substrate during the blowing step.

5. The method according to claim 1, wherein a gas blowing port of the second nozzle is inclined in the radial direction with respect to the surface of the substrate while the second nozzle moves in the radial direction during the blowing step.

6. The method according to claim 1, wherein the gas comprises at least one of nitrogen gas, a carbon dioxide gas, an argon gas, a helium gas, and air.

7. The method according to claim 1, further comprising:

cooling the gas to 2 to 10° C. before the second nozzle blows the gas.

8. The method according to claim 1, further comprising:

forming at least one patterned film on the surface of the substrate before the disposing step.

9. The method according to claim 1, further comprising:

treating the surface with a chemical solution before the disposing step; and applying a chemical mechanical polishing treatment to the surface treated with the chemical solution before the disposing step.

10. The method according to claim 1, further comprising:

treating the surface with a chemical solution to etch and to wash the surface before the disposing step.

11. The method according to claim 2, wherein the rotational speed of the substrate begins to increase substantially simultaneously as the second nozzle begins to move in the radial direction, and wherein the rotational speed reaches a substantially constant speed while the second nozzle moves.

12. The method according to claim 2, wherein the rotational speed of the substrate begins to increase substantially simultaneously as the second nozzle begins to move in the radial direction, and wherein the second nozzle stops moving while the substrate rotates at a substantially constant speed after the rotational speed reaches the substantially constant speed.

* * * * *